United States Patent [19]
Chen

[11] Patent Number: 5,777,264
[45] Date of Patent: Jul. 7, 1998

[54] GROUNDING STRUCTURE FOR EXTRACTABLE HARDDISK

[76] Inventor: Chih-Kung Chen, 2Fl., No. 1-16, Tung Shih Street, Nuan Nuan Dist. Chi Lung City, Taiwan

[21] Appl. No.: 845,277

[22] Filed: Apr. 28, 1997

[51] Int. Cl.[6] .................................................. H05K 5/02
[52] U.S. Cl. .................. 174/51; 361/68; 361/759; 361/753; 174/52.1
[58] Field of Search ........................... 361/685, 726, 361/759, 683, 684, 747, 737, 752, 753, 740; 439/928.1; 364/708.1; 174/51, 35 R, 52.1

[56] References Cited

U.S. PATENT DOCUMENTS 5,442,513  8/1995  Lo ............................................ 361/685

Primary Examiner—Kristine L. Kincaid
Assistant Examiner—Hung V. Ngo
Attorney, Agent, or Firm—Bacon & Thomas

[57] ABSTRACT

The present invention relates to a grounding structure for an extractable harddisk, including a first conductor bent from an open end of a rack frame of a harddisk box, and a lock head hole and an LED hole made on the conductor; a second conductor and third conductor mounted on the rear side of the first conductor, and the second conductor is vertical to the third conductor; the second conductor is raised on a long frame, and an expansion side is formed between the long frame and the third conductor; the rack frame is set in the retaining rails of a panel by means of the first conductor, and the lock head and an LED is mounted through the lock head hole and LED hole on the first conductor respectively, and the third conductor is screwed with the outer frame of a host unit so as to discharge static from the lock head and LED out of the host unit.

6 Claims, 5 Drawing Sheets

GROUNDING STRUCTURE FOR EXTRACTABLE HARDDISK

BACKGROUND OF THE INVENTION

The present invention relates to a grounding structure for extractable harddisk, and particularly to the grounding structure designed for the lock head of harddisk and LEE) under the lock head.

At present, computer-related hardware equipment have adopted a large volume of non-conductive plastic material owing to the factors of production convenience and cost though plastic material has such advantages as light weight and easy molding, however its non-conductive characteristic has resulted in a large amount of static charge accumulated in the computer and such static charge may cause damage to various circuits in the computer and what's worse it might cause a loss, of large volume of data stored.

In fact, the natural environment has more or less static which may just cause little bad feeling to human body. However, long-period of influence by static or sudden release of static may cause an unexpected harm: it is widely known that the risk of static after produced, if effectively led to the earth, may be eliminated. However, static existing everywhere makes the prevention very difficult and static prevention for the extractable harddisk is especially a tough task. Generally speaking, as mentioned above the casing of the harddisk is mostly made from plastic material and static can not be transmitted to the conductive casing of the host unit by means of said casing. The elimination of static generally depends on the way that the harddisk is mounted on a metallic rack which is screwed with the casing of host unit so as to eliminate static produced within the harddisk box through the casing of the host unit. However, such elimination of static is limited to the fixed harddisk in the host unit and another way shall be adopted for the extractable harddisk.

Theoretically, the extractable harddisk will not join with the host unit until it is going to be used so its static prevention device shall he installed on the harddisk rack to join with the host unit so as to eliminate static when the harddisk is mounted in the rack; however, the rack, in general, is made from non-conductive plastic material and therefore it can not transmit static to the casing of host unit for elimination when it is mounted in the casing of host unit; thanks to the effort of some computer makers making an effective improvement for solving the non-conductive defect of the rack and the casing and the concrete measure, without making any improvement of material for the rack and the harddisk box, lies in a metallic reed 10 mounted on the match side between the plastic-made rack 11 and the harddisk box 12, and the reed of the rack 11 is screwed to the metallic casing 13 of host unit, and when the harddisk box 12 is mounted in the rack 11, mutual contact of metallic reed 10 may eliminate static through the casing 13 of host unit (FIG. 1).

When computer makers are devoted to improving grounding structure for extractable harddisk and obtain some concrete result, another static prevention problem happened to extractable harddisk while rarely known has caused impact to extractable harddisk and its damage to extractable harddisk is greater than before; the problem existing for long while not vet discovered by computer makers lies in the lock head and LED on the rack of extractable harddisk; at Present, personal computer host unit producers around the world have mounted a lock head on the casing panel of host unit for starting the harddisk and preventing extractable harddisk from accidental extraction; referring to FIGS. 2 and 3, the lock head 14 is mounted through the lock hole 150 on the front panel 15 of harddisk rack 11 and is fastened on the rack 11 by means of a metallic pin 16 inserted, and the tail end of said lock head 14 is connected to the joint circuit on the rack and main circuit of host unit by means of a cord 17 and there are two LED holes 151 under the lock hole 150 and LED are mounted therein for indicating the harddisk ON/OFF.

Referring to FIGs. 2 and 3, the main part of the lock head 14 of extractable harddisk invaded by static lies in the pitch between the metallic lock head 14 and LED hole 151, and the reason is described below: 1. As metallic lock head is cornductive, when it is attacked by static produced from the nature, static will be directly led to the end circuit of the rack 11 from the lock head through the cord 17 to cause disturbance and damage to the circuit of the rack; such condition is most likely to happen in the place with dry climate and a large amount of static accumulated in air and therefore computer equipment often get damage due to unknown cause. 2. When LED 18 is mounted in the panel hole 151, there will have a small pitch between them and no static may occur in the pitch for the rack Panel 15 is made from plastic material; however, if the climate is too wet and the computer stays idle for lone there will be dew produced at the pitch; owing to this cause, the non-conductive pitch will become a conductor, and if high-energy static suddenly comes from air, static will be led to the cord of LED through the pitch and further transmitted to the circuit of host unit, and this will cause failure of host unit.

The aforesaid two static problems happened to the rack panel of harddisk is known by very few of computer makers after some research with effort but no concrete solution is found; without knowing this most of makers still produce a large number of computers lacking of static prevention device or only having half-set static prevention device mounted between the rack and the harddisk box while consumers have used such products without being informed of the problem; once the computer is burned down or data is suddenly lost, the maker may just suggest the user to change a new one and the user has no choice but complains of his own fault in operation. such an event has repeated over and over again everywhere if only there has the computer used.

To solve the aforesaid static problem which is rarely known but greatly harmful to the computer we provide a more satisfactory grounding structure than any other products at present; the present structure relates to two inside panels of the rack made from metallic material, and the opening end of panel is bent into a first conductor, and said conductor has lock head hole and LED) hole; the rear section of said first conductor is bent with the second and third conductors; the lock head is mounted through the lock head hole, joining the second conductor side by side, and LED is mounted through LED hole to join the first conductor side by side by means of the pin inserted in the lock head; and the third conductor is screwed with the metallic casing of host unit and static to occur at the lock head and LED will be discharged from the grounding structure of the casino through the guidance of each conduct.

These and other objects and advantages of the present invention will become apparent to those skilled in art after considering the following detailed specification together with the accompanying drawings.

3

Figure 1:
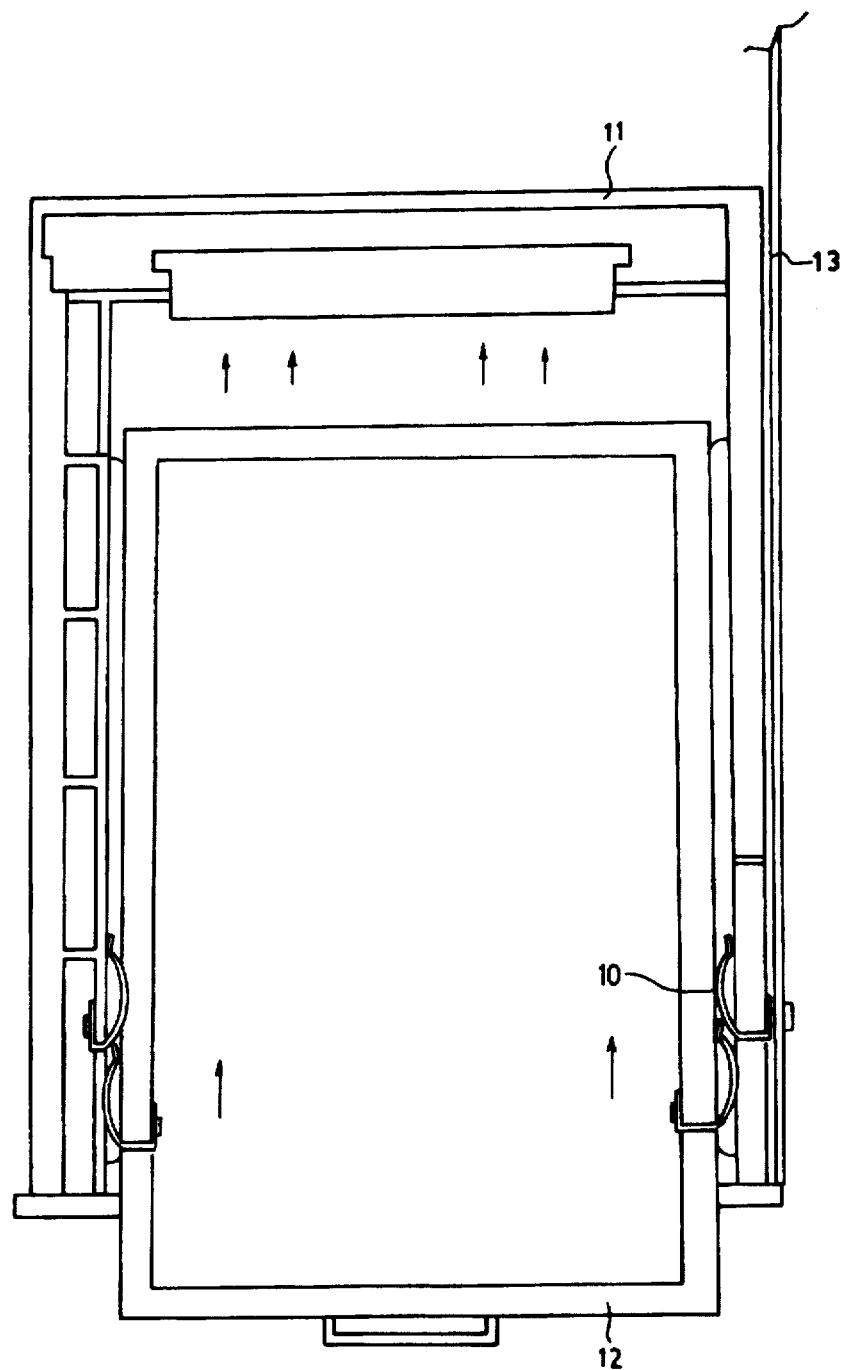
FIG. 1 is a flat view of the grounding structure of the existing extractable harddisk.
Figure 2:
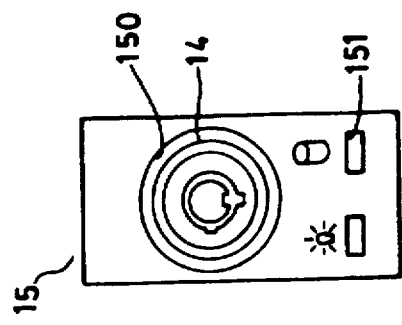
FIGS. 2 and 3 are a structural mounting diagram of the lock head and LED of the existing extractable harddisk.
Figure 3:
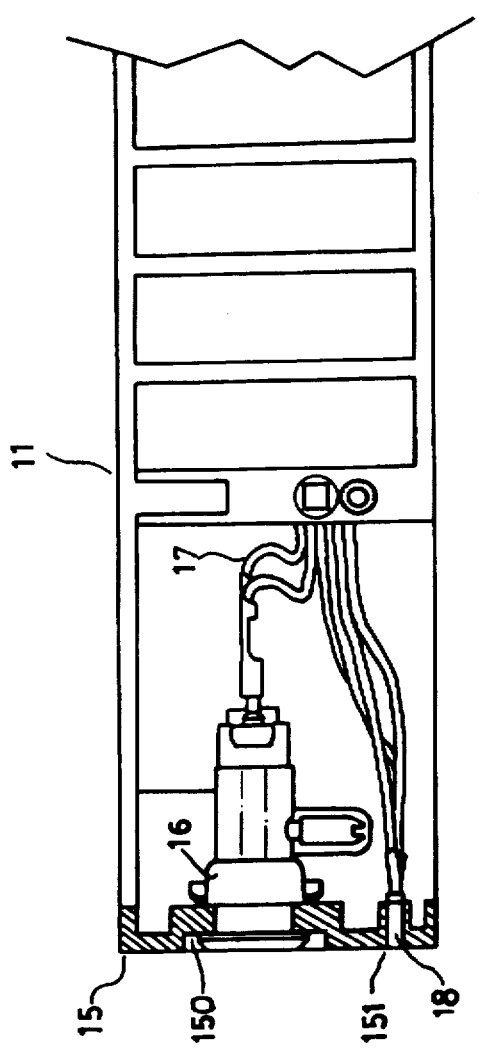
Figure 4:
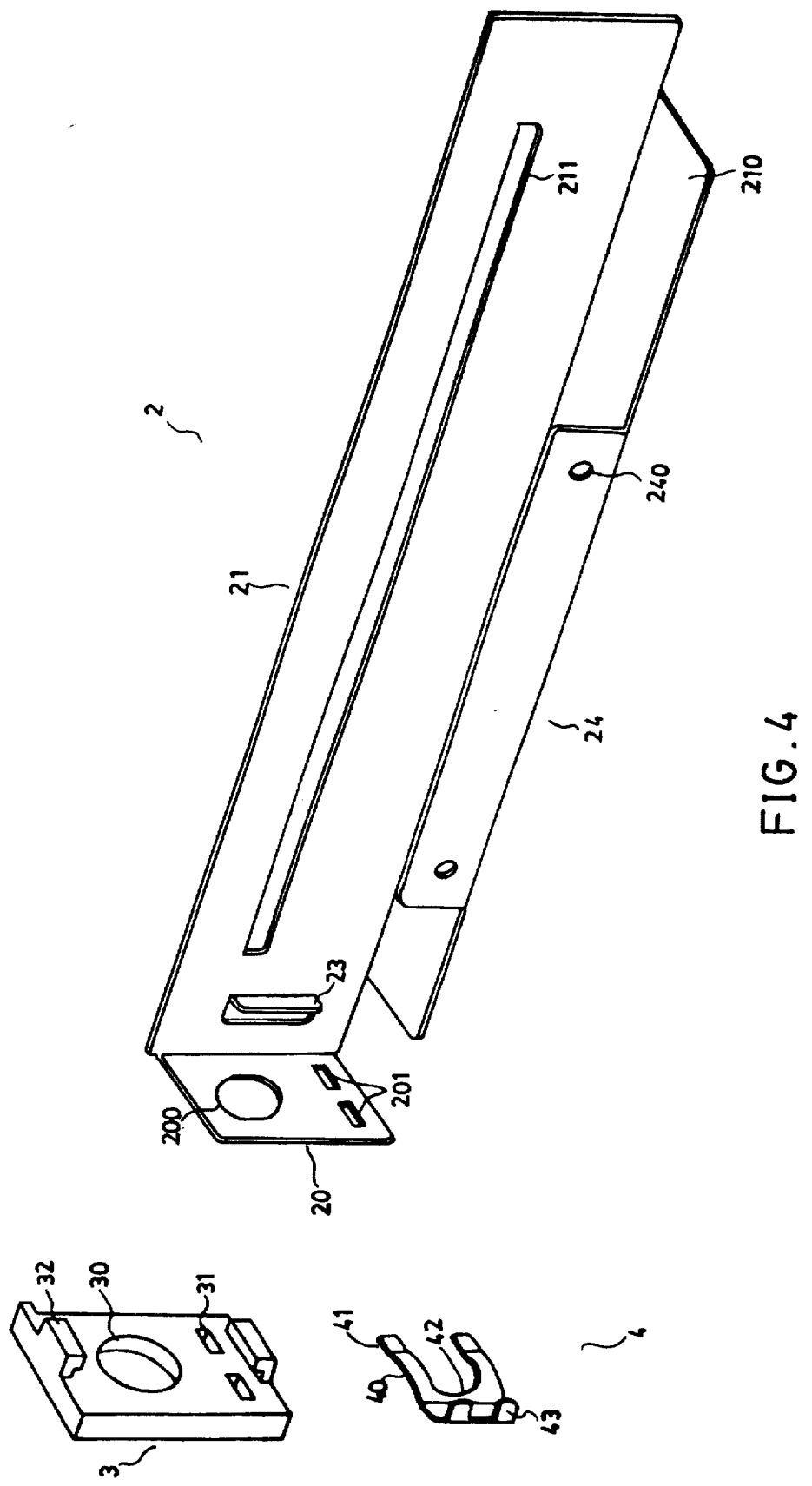

FIG. 4 is a sectional-elevational view of the parts of the present invention.

Figure 5:
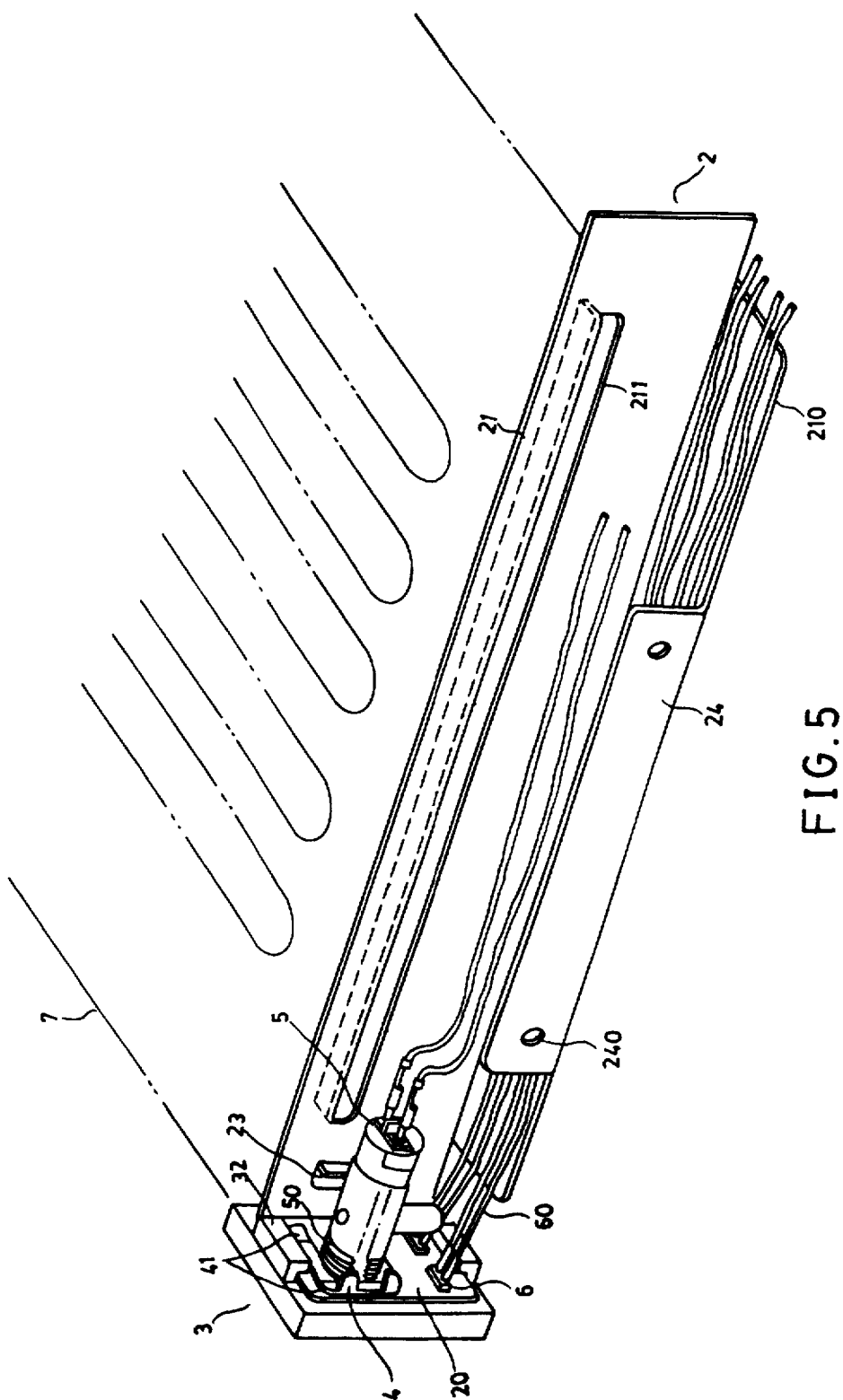

FIG. 5 is an elevational view of the connection structure of the present parts and the lock head and LED.

Figure 6:
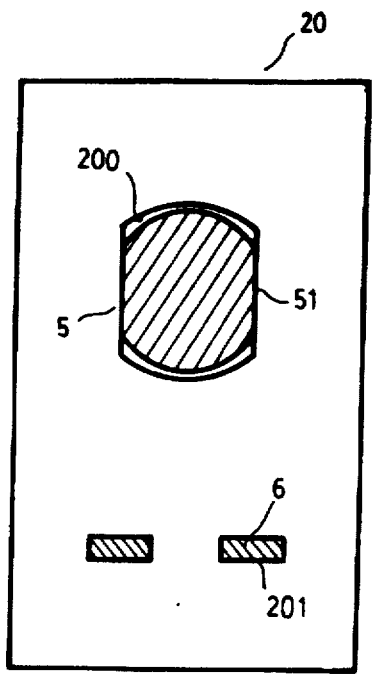
Figure 7:
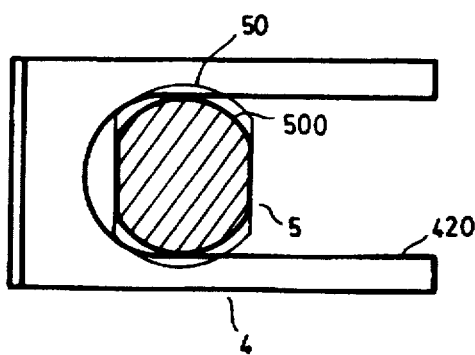
Figure 8:
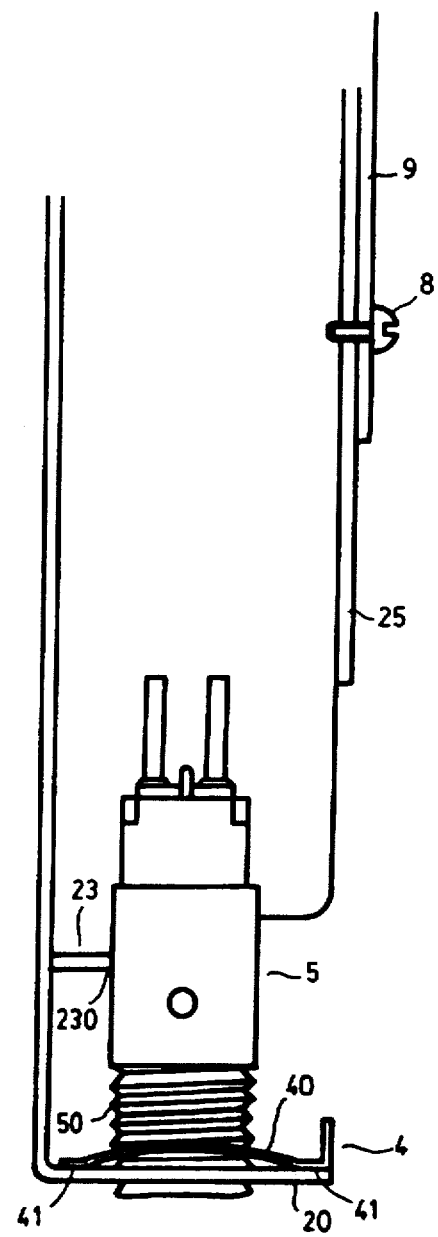

FIGS. 6 thru 8 are a schematic drawing of the conduction through the connection of each conductor, lock head and LED.

DETAILED DESCRIPTION OF PREFERRED EMBODIMENT

Referring to FIG. 4. the present invention comprises a rack frame 2. a panel 3 and a pin 4. wherein an opening end of rack frame 2 forms an L-shape first conductor 20. and a lock head hole 200 is formed thereon and two LED holes 201 are made under the first conductor: a second conductor 23 is formed on the rear side of the first conductor and parallel to it; a third conductor 24 is formed on the rear side of the second conductor 23 and parallel to the long frame 21. and the third conductor is bent vertically from the expansion side 210 of long frame. and a couple of screw holes 240 are made on the third conductor; a retaining slot 211 is horizontally made on the long frame 21. and the panel 3 is non-cornductive and a lock head hole 30 is made thereon and LED hole 31 is made under it. and a pair of inverted L-shape setting rails 32 are formed between the top end and bottom end in the center of the panel 3; a pin 4 is an L-shape thin sheet conductor and the cross section of it is an arc projection 40 in the center and flat side 41; the end of longitudinal section appears a long circular opening 42 and the other end appears a folding angle 43.

Referring to FIG. 5 the rack frame 2 is laid in the setting rails 32 of the panel 3 by means of the first conductor 20 to join the rack frame 2 with the panel 3. and the lock head hole 200 of the first conductor 20. LED holes 201. lock head hole 30 on the panel 3 and LED hole 31 will be joined together respectively (not shown); and the lock head 5 is then mounted in the rack frame 2 from the panel 3 through the first conductor 20. and LED 6 is mounted in the LED hole 201 of the first conductor 20; and the pin 42 is horizontally inserted in the thread section 50 of lock head with its opening 42. and flat side 41 of the pin is closely. contacted with the first conductor 20; the means of using the pin 4 to fix the lock head 5 to the panel 3 is found in the conventional harddisk. but the lock head 5 of the present invention is mounted through the panel 3 and further through the first conductor 20, and tail end of lock head is contacted with the second conductor 23 side by side; the cord 60 on the distal end of LED is hung on the expansion side 210 of long frame 21. and retaining slot 211 of long frame is provided as a guideway for mounting the harddisk box into the rack.

Referring to FIG. 6 thru 8, when the lock head 5 and LED 6 are mounted in the rack frame 2. the reason for elimination of static lies in: two planes 51 on both sides of lock head 5 are closely contacted with the lock head holes 200 of the first conductor 20. and the entire fledge of LED 6 is put in the LED hole 201 of the first conductor 20 (FIG. 6). and the pin 4 is inserted in the thread section 50 of lock head to allow the thread valley 500 of the thread section 50 to contact with the internal edge 420 of pin opening 42. and the flat side 41 of the pin 4 is contacted with the first conductor 4 (FIGS. 7 and 8). and the plane 51 of lock head 5 is closely contacted with the side edge 230 of the second conductor 23 and the third conductor 24 is screwed with the outer frame 9 of host unit by means of a screw 8 (FIG. 8); the present invention is to discharge static to occur at the lock head and LED from the outer frame 9 of host unit to the ground by means of leading by each contact point so as to eliminate static. and even if static having entered LED may be led to the casing of host unit for elimination through the metallic ring connected to the LED hole 201 of the first conductor 20.

4

Each contact point of the present invention which may. discharge static from the lock head and LED is described below:

1. The contact side between the plane 51 beside the lock head and the lock head hole 200 of the first conductor.

2. The ring side between the outer frame of LED 6 and LED hole 201 of the first conductor.

3. The contact between the thread valley 500 of lock head thread section 50 and the internal edge 420 of pin opening 42.

4. The joint between the flat side 41 of the pin and the plane of the first conductor 20.

5. The joint between the belly side 51 of lock head and side edge 230 of the second conductor.

6. The thread connection between the third conductor 24 and the outer frame 9 of host unit.

The present invention is to discharge static from the lock head and LED out of host unit through the said six contact point so as to avoid damage of static to the extractable harddisk or other equipment from the lock head or LED; another function of said 5th joint between the belly side of lock head and side edge of the second conductor is to prevent sidewise bending of lock head due to torsion when the lock head is open or close. and further to allow full contact between the lock head and the first conductor; according to the structural design of the present problem invention. it may totally solve static problem at the lock head and LED generally neglected by the computer makers and may provide the users with safety of operation.

I claim:

1. A grounding structure for an extractable harddisk. comprising: an L-shape first conductor bent from an open end of a rack frame. and a first lock head hole located on said first conductor and first LED holes located under the first lock head hole; a second conductor on the rack frame located on a rear side of said first conductor and parallel to the first conductor. said second conductor raised on the rack frame; a third conductor located to a rear side of said second conductor said third conductor having a plurality of screw holes. the rack frame joined with a panel by insertion of the first conductor into inverted L-shaped setting rails of the panel. the panel having a second lock head hole and second LED holes aligned with the first lock head hole and first LED holes. respectively; a lock head placed through the first and second lock head holes; a pin enraging a threaded section of the lock head having an opening along a side of said first conductor to fix the lock head to the panel and the rack frame such that the lock head is in contact with the second conductor; an LED mounted through said first and second LED holes from the first conductor to the panel. a cord connected to the LED laying flat on the rack frame.

2. The grounding structure for an extractable harddisk as claimed in claim 1. wherein the lock head has opposite planar surfaces in contact with the first lock head hole of the first conductor.

3. The grounding structure for an extractable harddisk as claimed in claim 1. wherein the LED has an outer frame in contact with the first LED hole of the first conductor.

4. The grounding structure for an extractable harddisk as claimed in claim 1. wherein the pin contacts a portion of the threaded section of the lock head.

5. The grounding structure for an extractable harddisk as claimed in claim 1. wherein a side of the pin is in contact with the first conductor.

6. The grounding structure for an extractable harddisk as claimed in claim 1. wherein the third conductor is fastened to an outer frame of a host unit.

* * * * *